(12) United States Patent
Moallem

(10) Patent No.: US 12,015,191 B2
(45) Date of Patent: Jun. 18, 2024

(54) ANTENNA-ON-PACKAGE INTEGRATED CIRCUIT DEVICE

(71) Applicant: Texas Instruments Incorporated, Dallas, TX (US)

(72) Inventor: Meysam Moallem, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/559,094

(22) Filed: Sep. 3, 2019

(65) Prior Publication Data

US 2020/0259240 A1 Aug. 13, 2020

Related U.S. Application Data

(60) Provisional application No. 62/803,168, filed on Feb. 8, 2019.

(51) Int. Cl.
*H01Q 1/22* (2006.01)
*H01Q 23/00* (2006.01)
(Continued)

(52) U.S. Cl.
CPC ........... *H01Q 1/2283* (2013.01); *H01Q 23/00* (2013.01); *H01L 27/0203* (2013.01); *H01Q 1/24* (2013.01)

(58) Field of Classification Search
CPC ........ H01Q 1/2283; H01Q 1/24; H01Q 1/521; H01Q 1/38; H01Q 23/00; H01Q 21/065; H01Q 9/0407; H01L 27/0203; H01L 28/10
See application file for complete search history.

(56) References Cited

U.S. PATENT DOCUMENTS

| 5,382,959 A | 1/1995 | Pett et al. |
| 6,130,640 A | 10/2000 | Uematsu et al. |

(Continued)

FOREIGN PATENT DOCUMENTS

| WO | 2014110273 A1 | 7/2014 |
| WO | 2015157548 A1 | 10/2015 |
| WO | 20180046884 A1 | 1/2018 |

OTHER PUBLICATIONS

International Search Report for PCT/US2020/017250 dated May 14, 2020.

(Continued)

*Primary Examiner* — Seokjin Kim
(74) *Attorney, Agent, or Firm* — Michael T. Gabrik; Frank D. Cimino

(57) ABSTRACT

An integrated circuit package is provided. In some examples, the integrated circuit package is an antenna-on-package package that includes an integrated circuit die and an antenna substrate coupled to the integrated circuit die. The antenna substrate includes a conductor layer and a first dielectric layer disposed between the conductor layer and the integrated circuit die. The conductor layer includes antennas electrically coupled to the integrated circuit die. The integrated circuit package further includes an I/O substrate coupled to the integrated circuit die opposite the antenna substrate. In some such examples, the I/O substrate includes interconnect connectors and a second dielectric layer disposed between the interconnect connectors and the integrated circuit die. In some such examples, the integrated circuit package includes interconnect connectors extending between the antenna substrate and the I/O substrate.

12 Claims, 15 Drawing Sheets

(51) Int. Cl.
*H01L 27/02* (2006.01)
*H01Q 1/24* (2006.01)

(56) References Cited

U.S. PATENT DOCUMENTS

| | | | |
|---|---|---|---|
| 9,589,917 B1 | 3/2017 | Rodriguez et al. | |
| 10,461,399 B2* | 10/2019 | Ndip | H01L 23/5384 |
| 2006/0092076 A1* | 5/2006 | Franson | H01Q 3/20 |
| | | | 343/711 |
| 2008/0136710 A1 | 6/2008 | Nefedov et al. | |
| 2009/0322643 A1 | 12/2009 | Choudhury | |
| 2012/0212384 A1 | 8/2012 | Kam et al. | |
| 2013/0027269 A1 | 1/2013 | Orime et al. | |
| 2014/0110840 A1 | 4/2014 | Wojnowski et al. | |
| 2014/0197996 A1 | 7/2014 | Yonei et al. | |
| 2015/0084194 A1 | 3/2015 | Molzer et al. | |
| 2015/0270616 A1 | 9/2015 | Jafarlou et al. | |
| 2015/0325925 A1 | 11/2015 | Kamgaing et al. | |
| 2016/0028162 A1 | 1/2016 | Ou et al. | |
| 2016/0049723 A1 | 2/2016 | Baks et al. | |
| 2016/0056544 A1* | 2/2016 | Garcia | H01Q 9/0407 |
| | | | 343/725 |
| 2017/0033062 A1 | 2/2017 | Liu et al. | |
| 2017/0250457 A1 | 8/2017 | Murata et al. | |
| 2018/0191053 A1* | 7/2018 | Ndip | H01L 24/73 |
| 2018/0226727 A1* | 8/2018 | Sato | H01Q 21/28 |
| 2018/0247905 A1 | 8/2018 | Yu et al. | |
| 2018/0277946 A1* | 9/2018 | Murata | H01Q 1/48 |
| 2018/0315715 A1 | 11/2018 | Chiu et al. | |
| 2018/0331051 A1* | 11/2018 | Dogiamis | H01L 23/66 |
| 2018/0350772 A1* | 12/2018 | Nair | H01L 23/5383 |
| 2019/0115646 A1* | 4/2019 | Chiu | H01L 23/3114 |
| 2019/0189572 A1* | 6/2019 | Chiang | H01L 23/5226 |
| 2019/0288382 A1* | 9/2019 | Kamgaing | H01Q 21/22 |
| 2019/0305428 A1* | 10/2019 | Hwang | H01Q 9/045 |
| 2020/0091599 A1* | 3/2020 | Nakamura | H01Q 1/38 |
| 2020/0259239 A1 | 8/2020 | Moallem et al. | |
| 2021/0036405 A1* | 2/2021 | Han | H01Q 1/2283 |
| 2021/0036413 A1* | 2/2021 | Kim | H01L 23/5385 |
| 2021/0058800 A1* | 2/2021 | Cheon | H01Q 1/246 |

OTHER PUBLICATIONS

Extended European Search Report, European Patent Application No. 20751989.3, dated Mar. 14, 2022, 9 pages.
Guterman et al., "Reconfigurable E-Shaped Patch Antennas," IEEE International Workshop on Antenna Technology, Mar. 2009, 4 pages.

* cited by examiner

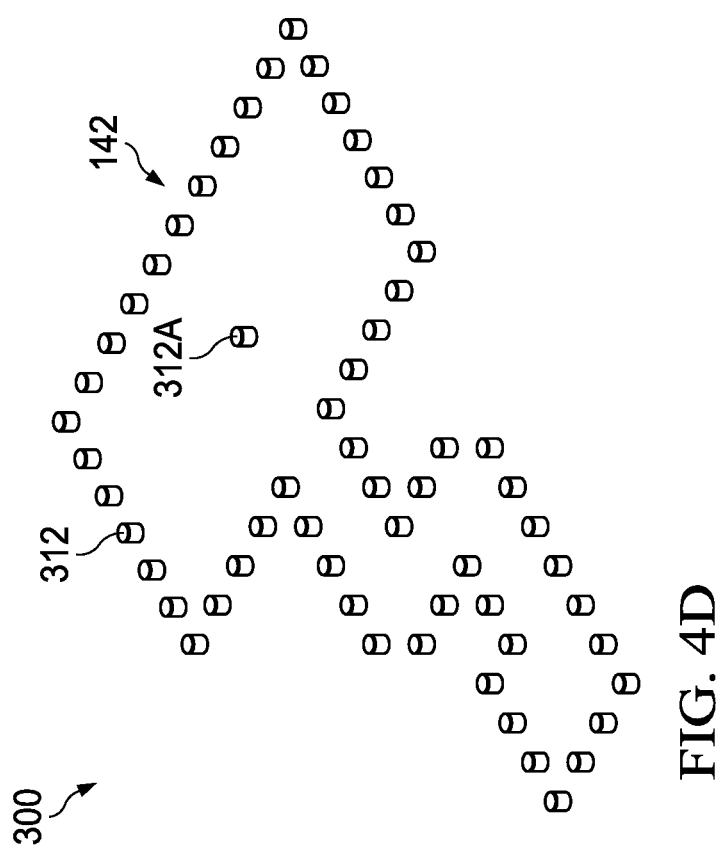

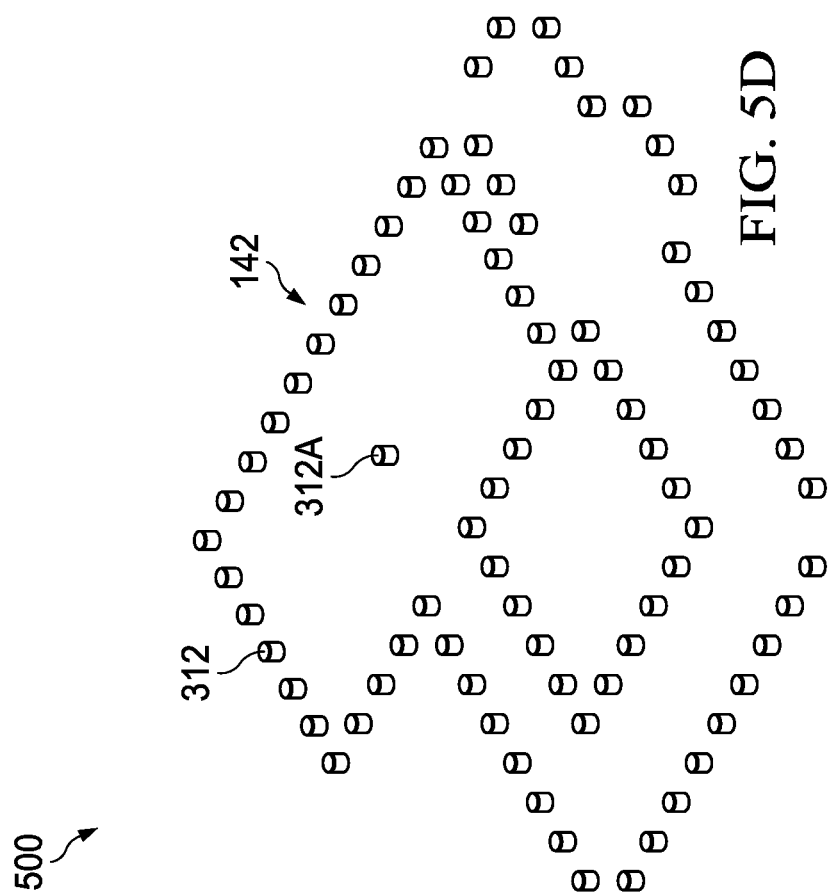

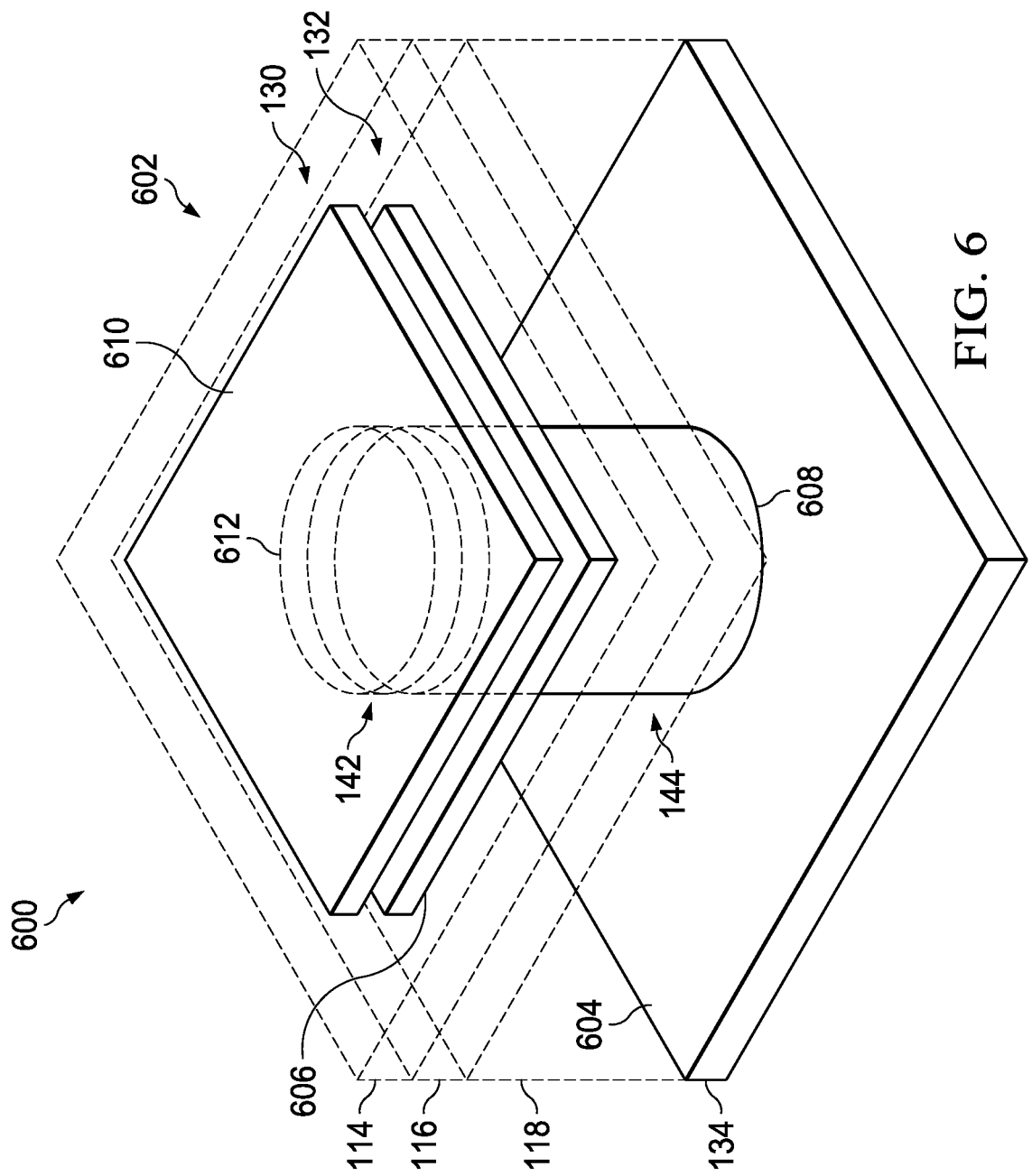

ANTENNA-ON-PACKAGE INTEGRATED CIRCUIT DEVICE

CROSS-REFERENCE TO RELATED APPLICATIONS

This application claims the benefit of and priority to U.S. Provisional Application No. 62/803,168 to Meysam Moallem, filed on Feb. 8, 2019, the entire disclosure of which is hereby incorporated by reference.

BACKGROUND

Large-scale radar systems are used for tracking aircraft, forecasting weather, studying geological formations, observing planets, and other long-range applications. Such systems are often large and powerful. At the same time, rapid advances in signal processing and semiconductor fabrication have allowed radar systems to be miniaturized. These low-power, low-cost radar systems have opened the door to a wide variety of applications including self-driving cars, automated material-handling systems, collision avoidance, and other applications.

A radar system senses distant objects by emitting electromagnetic waves using one or more transmitter antennas and receiving reflections of the electromagnetic waves using one or more receiver antennas. Control of the transmitted signals and processing of the received signals may be performed by a number of active and passive integrated circuit devices on one or more integrated circuit dies. In turn, the dies and devices may be incorporated into one or more semiconductor packages. A semiconductor package surrounds and protects the incorporated integrated circuit dies and/or devices. The package may include layers of rigid insulating material and layers of conductive material that extend through the insulating material to connect the dies and devices to each other and to the remainder of the system.

SUMMARY

In some examples, a Monolithic Microwave Integrated Circuit (MMIC) package is provided that includes an integrated circuit die, a set of transmitter antennas, and a set of receiver antennas. Accordingly, the MMIC package may be referred to as an Antenna-On-Package (AOP) radar device.

In some examples, an integrated circuit package includes an integrated circuit die and a first substrate coupled to the integrated circuit die. The first substrate includes a conductor layer and a first dielectric layer disposed between the conductor layer and the integrated circuit die. The conductor layer includes antennas electrically coupled to the integrated circuit die. The integrated circuit package further includes a second substrate coupled to the integrated circuit die opposite the first substrate.

In further examples, an integrated circuit package includes an integrated circuit die with a first side. An antenna substrate is coupled to the first side of the integrated circuit die. The antenna substrate includes a radar antenna electrically coupled to the integrated circuit die and a first dielectric layer disposed between the radar antenna and the integrated circuit die. An I/O substrate is coupled to the antenna substrate such that the integrated circuit die is disposed between the I/O substrate and the antenna substrate. The I/O substrate includes package connectors electrically coupled to the integrated circuit die and a second dielectric layer disposed between the package connectors and the integrated circuit die.

In yet further examples, a package substrate includes dielectric layers and layers of conductive features disposed within the dielectric layers that include a first layer and a second layer disposed on the first layer. The first layer is configured to couple to a bond pad of a die and to another substrate by a package interconnect connector, and the second layer includes a radar antenna configured to be electrically coupled to the die.

BRIEF DESCRIPTION OF THE DRAWINGS

FIGS. 4A-4E are perspective views of layers of a package that includes a package-integrated antenna according to some aspects of the present disclosure.

FIGS. 5A-5E are perspective views of layers of a package that includes a package-integrated antenna according to some aspects of the present disclosure.

FIG. 6 is a perspective view of a package that includes an electromagnetic band gap cell according to some aspects of the present disclosure.

DETAILED DESCRIPTION

Figure 1:
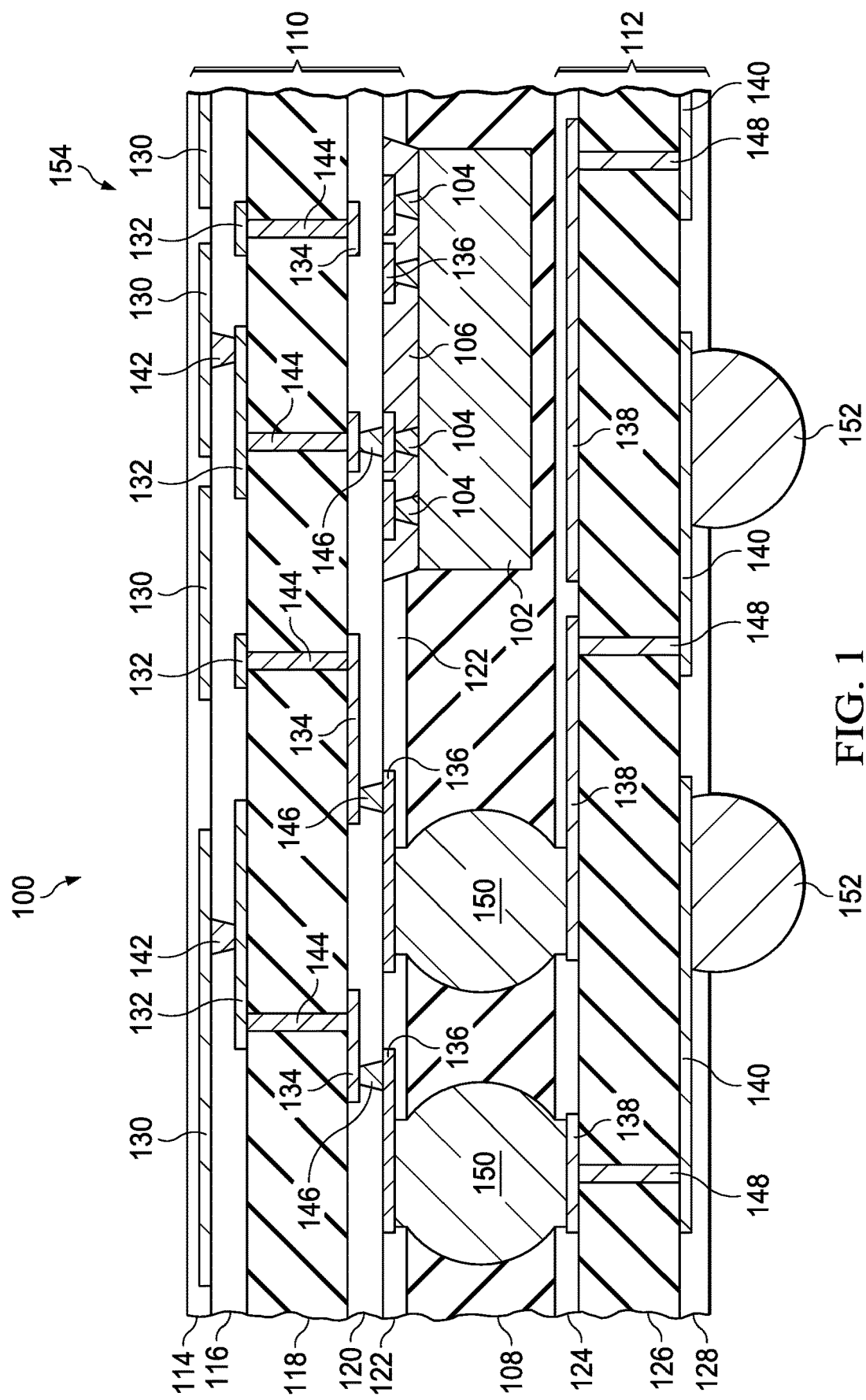
FIG. 1 is a cross sectional view of a portion of an antenna-on-package integrated circuit package according to some aspects of the present disclosure.

Specific examples are described below in detail with reference to the accompanying figures. It is understood that these examples are not intended to be limiting, and unless otherwise noted, no feature is required for any particular example. Moreover, the formation of a first feature over or on a second feature in the description that follows may include examples in which the first and second features are formed in direct contact and examples in which additional features are formed between the first and second features, such that the first and second features are not in direct contact.

In accordance with convention in the art, relative terms that describe orientation, such as "above," "below," "over," "under," "on," etc., are provided for clarity of discussion and are not absolute relationships. For example, a first element that is "above" a second element may be just as accurately described as "below" the second element if the orientation of the device is flipped.

The present disclosure provides a semiconductor package, such as a Monolithic Microwave Integrated Circuit (MMIC) package. The package includes transmitter and receiver radar antennas and an integrated circuit die with radar-processing circuitry. The circuitry may perform various functions such as driving signals that control the transmitter antennas and processing signals received by the receiver antennas. As the name suggests, this type of package that includes antenna along with the control circuitry may be referred to as an Antenna-On-Package (AOP) device. Incorporating the radar antennas into the same package as the control circuitry may avoid many of the challenges of coupling the antennas to an integrated circuit die through a printed circuit board. It may also reduce power loss by improved coupling of signal paths to transmit and receive antennas, resulting in better radar performance (e.g., improved maximum range). It may also greatly reduce the size of the overall radar system and simplify integration of the radar system into a vehicle, factory, facility, or other environment. It may also reduce total system cost by eliminating the need for an expensive printed circuit board.

In some examples, the integrated circuit die is arranged in an embedded die configuration where a first package substrate is attached to the top of the die and a second package substrate is attached to the bottom of the die. Thus, the die is secured and protected between the substrates. One of the substrates (e.g., an antenna substrate) may be reserved primarily for radio-frequency signals to and from the antennas, and this substrate may include the antennas themselves disposed opposite the die. Because the antennas radiate energy through the thinner package top rather than through the bulk of the package, antenna efficiency may be improved and spurious radiation may be reduced. Furthermore, the configuration may reduce the overall package size by allowing antennas to be formed directly on top of the die. As yet a further advantage, this configuration allows the conductor levels of the antenna substrate to be reserved for routing transmission lines to and from the antennas with good isolation and minimal routing loss. The remaining package substrate may be reserved for routing of non-radio frequency I/O traces between the package connectors and the die. Thus, the routing of the non-radio frequency traces may be improved as well, and in some examples, the I/O substrate includes fewer conductor layers than comparable examples because the routing is simplified. In sum, this configuration may provide high antenna efficiency, small size, and efficient routing.

In some examples, the antennas are cavity-backed antennas shaped and configured to provide good antenna-to-antenna isolation. In some examples, the antennas may have a slotted E-shaped configuration to improve antenna bandwidth, and the slot position and depth may be tuned based on the desired frequency response. The antennas may be arranged in arrays, and in some examples, the antennas are arranged in two-dimensional arrays to provide beamforming in more than one dimension.

To isolate the receiver antennas from the transmitter antennas, the package may include Electromagnetic Band Gap (EBG) structures between the receiver antennas and the transmitter antennas and along the edges of the package that dampen surface waves and spurious radiation.

These advantages are merely provided as examples, and unless otherwise noted, no particular advantage is required for any particular embodiment.

Figure 2:
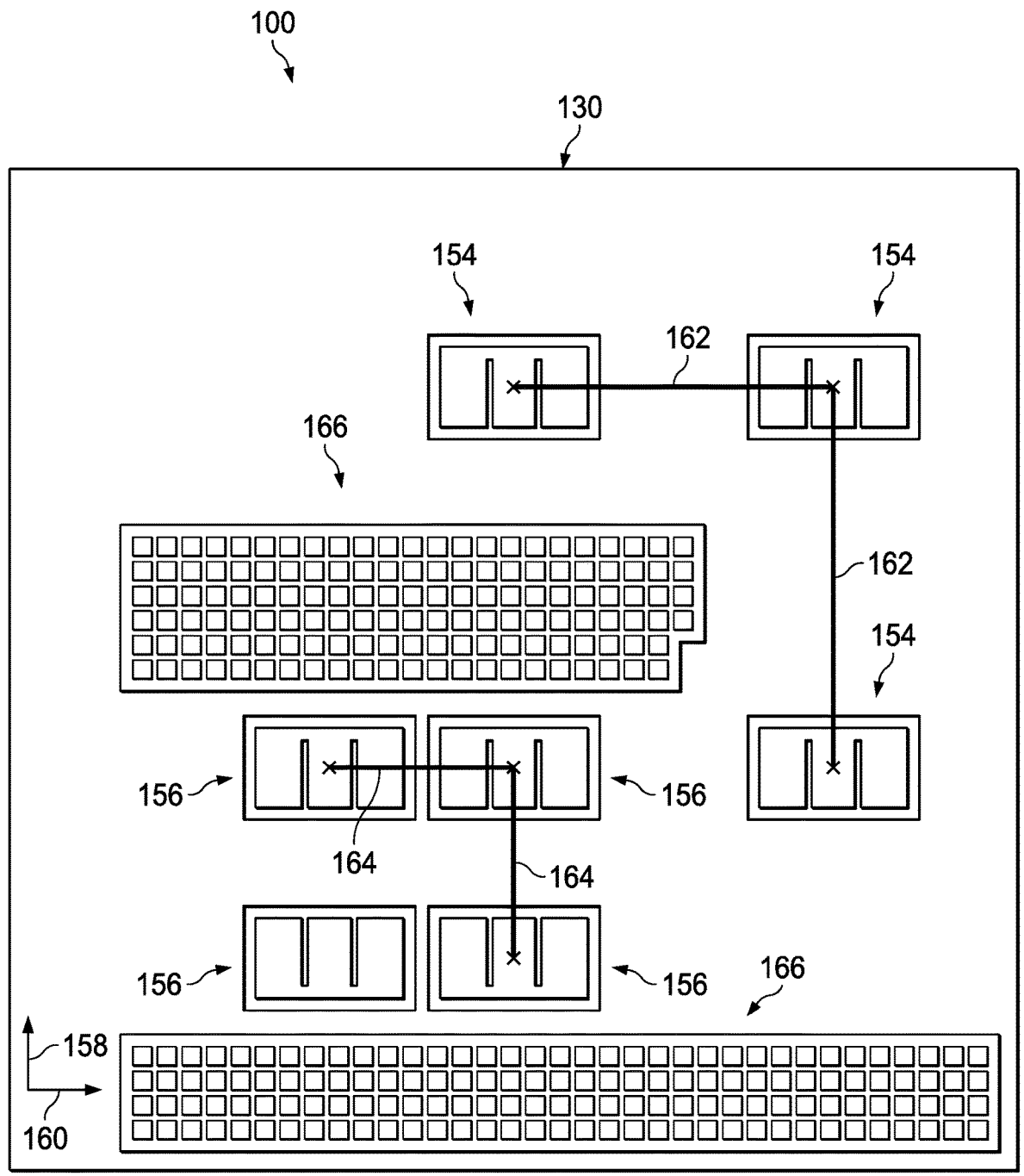
FIG. 2 is a top view of an antenna-on-package integrated circuit package according to some aspects of the present disclosure.

Examples of an AOP integrated circuit package 100 are described with reference to FIGS. 1 and 2. In that regard, FIG. 1 is a cross sectional view of a portion of the AOP integrated circuit package 100 according to some aspects of the present disclosure. FIG. 2 is a top view of the AOP integrated circuit package 100 according to some aspects of the present disclosure.

The integrated circuit package 100 may include a number of integrated circuit dies 102. In turn, each integrated circuit die 102 may include a number of active circuit elements (e.g., bipolar junction transistors, field effect transistors, etc.) and/or passive circuit elements (e.g., resistors, capacitors, inductors, diodes, transformers, etc.) formed on a semiconductor substrate. The circuit elements of the integrated circuit dies 102 may perform operations related to radar sensing such as driving radar transmitter antennas to produce electromagnetic waves and processing signals produced when reflected electromagnetic waves are received by radar receiver antennas.

Within an integrated circuit die 102, the circuit elements are electrically coupled by an electrical interconnect, which may include a number of bond pads 104 for sending and receiving signals off the die 102. To carry these signals beyond the die 102, the bond pads 104 are electrically coupled to the rest of the package 100 during a die attach process by a suitable technique, such as soldering, thermosonic bonding, ultrasonic bonding, epoxy die attach, and/or other suitable techniques.

Many of these techniques also provide a degree of physical coupling as the material (e.g., solder, underfill material 106) that electrically couples the bond pads 104 also physically couples the top or face of the die 102 to the package. To further secure the die 102 and to prevent intrusion by air and/or moisture, a mold compound 108 may also be applied to the top, sides, and/or bottom of the integrated circuit die 102. A mold compound 108 may include an epoxy resin with one or more fillers, catalysts, flame retardants, adhesion promotors, and/or other additives and may be configured to create a hermetic seal around the die 102. Suitable mold compounds 108 include epoxy cresol novolac (ECN) resins and other types of resins.

The illustrated package 100 is an example of an embedded-die package as the integrated circuit die 102 is coupled to a pair of package substrates 110 and 112, one on either side of the die 102. In a radar application, a first substrate (e.g., an antenna substrate 110) may be used primarily to carry radio frequency signals to and from antennas, which may be incorporated into the antenna substrate 110. The second substrate (e.g., an I/O substrate 112) may be used primarily to carry non-radio frequency signals between the die 102 and the ball grid array (BGA). The arrangement of the die 102 between the antenna substrate 110 and the I/O substrate 112 provides additional resistance against flexing, shock, and vibration and provides improved resistance to intrusion by air, moisture, and dust compared to other alternative arrangements. However, the embedded-die arrangement is merely one example, and other arrangements of the package 100 are contemplated and provided for.

Each package substrate 110 and 112 may include one or more dielectric layers 114-128 that provide physical support and isolation and a network of interconnecting conductors. Examples of dielectric layers include solder resist layers 114, 122, 124, and 128; intermediate dielectric layers 116 and 120; and core dielectric layers 118 and 126.

In an example, the antenna substrate 110 includes a back-side solder resist layer 114 disposed opposite the die 102, a first intermediate dielectric layer 116 disposed on the back-side solder resist layer 114, a core dielectric layer 118 disposed on the first intermediate dielectric layer 116, a second intermediate dielectric layer 120 disposed on the core dielectric layer 118, and a front-side solder resist layer 122 disposed on the second intermediate dielectric layer 120 proximate to the die 102.

In the example, the I/O substrate 112 includes a front-side solder resist layer 124 disposed proximate to the die 102, a core dielectric layer 126 disposed on the front-side solder resist layer 124, and a back-side solder resist layer 128 disposed on the core dielectric layer 126. In further examples, the package substrates 110 and 112 may include other numbers of dielectric layers.

As they may form the exterior of the package, the solder resist layers 114, 122, 124, and 128 (which may also be referred to as solder mask layers) may include dielectric materials selected to be impervious to air and moisture, to provide good crack resistance, and to control solder flow, in addition to providing electrical isolation. The solder resist layers 114, 122, 124, and 128 may be formed to any suitable thickness, and in various examples, the solder resist layers 114, 122, 124, and 128 are between about 5 µm and about 30 µm thick.

The intermediate dielectric layers 116 and 120 may include any suitable dielectric materials, and examples include resin laminates. The intermediate dielectric layers 116 and 120 may be formed to any suitable thickness and, in various examples, are between about 10 µm and about 50 µm thick.

The core dielectric layers 118 and 126 may provide the bulk of the rigidity and may be configured accordingly. In that regard, the core dielectric layers 118 and 126 may be thicker than the solder resist layers 114, 122, 124, and 128 and the intermediate dielectric layers 116 and 120. In some examples, the core dielectric layers 118 and 126 are between about 100 µm and about 400 µm thick. The core dielectric layers 118 and 126 may include any suitable dielectric materials, which may be selected, in part, based on resistance to deformation. In various examples, the core dielectric layers 118 and 126 include resin laminates and ceramics.

Conductive traces extend throughout the dielectric layers 114-128 to carry signals and power between the devices of the integrated circuit package 100. The traces may be divided among conductor layers 130-140 that extend primarily horizontally and conductive vias 142-148 that extend primarily vertically. For ease of reference, the horizontal conductor layers 130-136 of the antenna substrate 110 are referred to as M1 layer 130, M2 layer 132, M3 layer 134, and M4 layer 136; and via layers 142-146 are referred to as V1 layer 142, V2 layer 144, and V3 layer 146. Similarly, horizontal conductor layers 138 and 140 of the I/O substrate 112 are referred to as M1 layer 138 and M2 layer 140; and via layer 148 is referred to as V1 layer 148. In further examples, the antenna substrate 110 and I/O substrate 112 include other numbers of conductor layers. The conductive traces within the layers 130-148 may include any suitable conductive material, such as copper, aluminum, gold, silver, nickel, tungsten, and/or alloys thereof.

The integrated circuit package 100 may include a first set of package interconnect connectors 150 alongside the die, such as an interposer, a bridge, a ball grid array, a land grid array, and/or a pin grid array, to carry signals and power between the conductive layers of the antenna substrate 110 and the conductive layers of the I/O substrate 112. The package interconnect connectors 150 may extend through the mold compound 108 to physically and electrically couple the antenna substrate 110 to the I/O substrate 112.

The integrated circuit package 100 may also include a second set of package interconnect connectors 152, such as ball grid array connectors, land grid array connectors, pin grid array connectors, and/or surface-mount leads, to carry signals and power between the devices of the integrated circuit package 100 and the remainder of a radar system. In particular, conductive features of the I/O substrate 112 and/or the antenna substrate 110 couple the package interconnect connectors 152 to the integrated circuit die 102 to carry the signals and power.

The AOP package 100 may include a number of antennas coupled to the circuitry of the die 102. Examples of transmitter antennas 154 and receiver antennas 156 are shown in the top view of FIG. 2. In this particular view, the topmost solder resist layer 114 of the antenna substrate 110 is omitted to better illustrate the underlying layers including the M1 layer 130 of the antenna substrate 110, which is used to form the set of radar transmitter antennas 154 and the set of radar receiver antennas 156. Example structures of the antennas 154 and 156 are described in more detail in subsequent figures.

The integrated circuit package 100 may include any number of radar transmitter antennas 154 and receiver antennas 156 depending on the application. The antennas may be grouped into arrays, and in some examples, the transmitter antennas 154 and receiver antennas 156 are arranged to produce a Multi-Input Multi-Output (MIMO) array. MIMO arrays, depending on the physical arrangement of the antennas in the array, may allow beamforming in more than one plane (e.g., both the azimuth and elevation planes).

The illustrated package 100 is an example of an antenna configuration that produces a MIMO array with M*N virtual elements, where M represents the number of transmitter antennas 154, and N represents the number of receiver antennas 156. Depending on the application, the antennas 154 and 156 may be arranged in multi-dimensional arrays and/or single-dimension arrays. In a multi-dimensional array example, a transmitter antenna 154 is offset from some transmitter antennas 154 in a first direction 158 and offset from other transmitter antennas 154 in a second direction 160 perpendicular to the first direction 158. Similarly, in the example, a receiver antenna 156 is offset from some receiver antennas 156 in the first direction 158 and offset from other receiver antennas 156 in the second direction 160. In a single-dimension array example, the transmitter antennas 154 are aligned in the first direction 158 and the receiver antennas 156 are aligned in the same direction 158.

Within the arrays, the transmitter antennas 154 may be spaced apart from one another by any suitable amount, and the receiver antennas 156 may be spaced apart from one another by any suitable amount, which may be the same or different from the transmitter antenna 154 spacing. In some examples, the antennas 154 and 156 are configured to emit and receive electromagnetic waves at a set of frequencies and are arranged at a center-to-center pitch that is based on the wavelength of the electromagnetic waves at the center frequency (e.g., a wavelength of about 5 mm corresponding to a center frequency of about 60 GHz). In some such examples, adjacent transmitter antennas 154 are arranged at a pitch 162 that is one wavelength at the center frequency, and adjacent receiver antennas 156 are arranged at a pitch 164 that is about half of the wavelength at the center frequency.

To better isolate the receiver antennas 156 from direct interference by the transmitter antennas 154, the integrated circuit package 100 may also include Electromagnetic Band Gap (EBG) structures 166 between the transmitter antennas 154 and the receiver antennas 156. In some examples, the EBG structures 166 are configured to dampen surface waves along the integrated circuit package 100 and other sources of interference. In various examples, the EBG structures 166 have been demonstrated to improve isolation by 6 dB or more. The EBG structures 166 may also be configured to improve the radiation patterns of the antennas 154 and 156. The EBG structures 166 may include a number of conductive features in the conductor layers 130, 132, 134, 142, and 144, and example configurations are described in more detail below.

Figure 3:
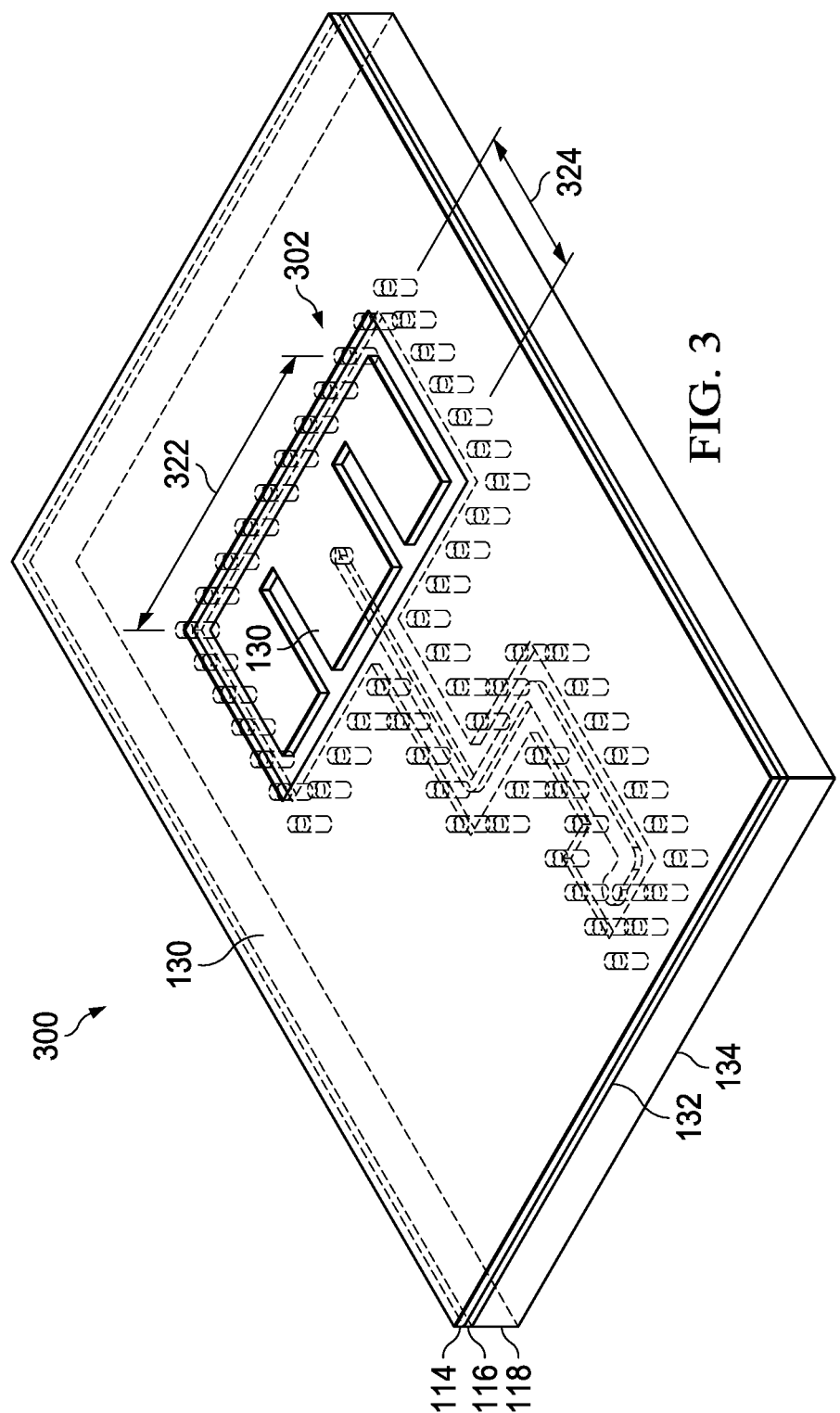
FIG. 3 is a perspective view of a package that includes a package-integrated antenna according to some aspects of the present disclosure.
Figure 4A:
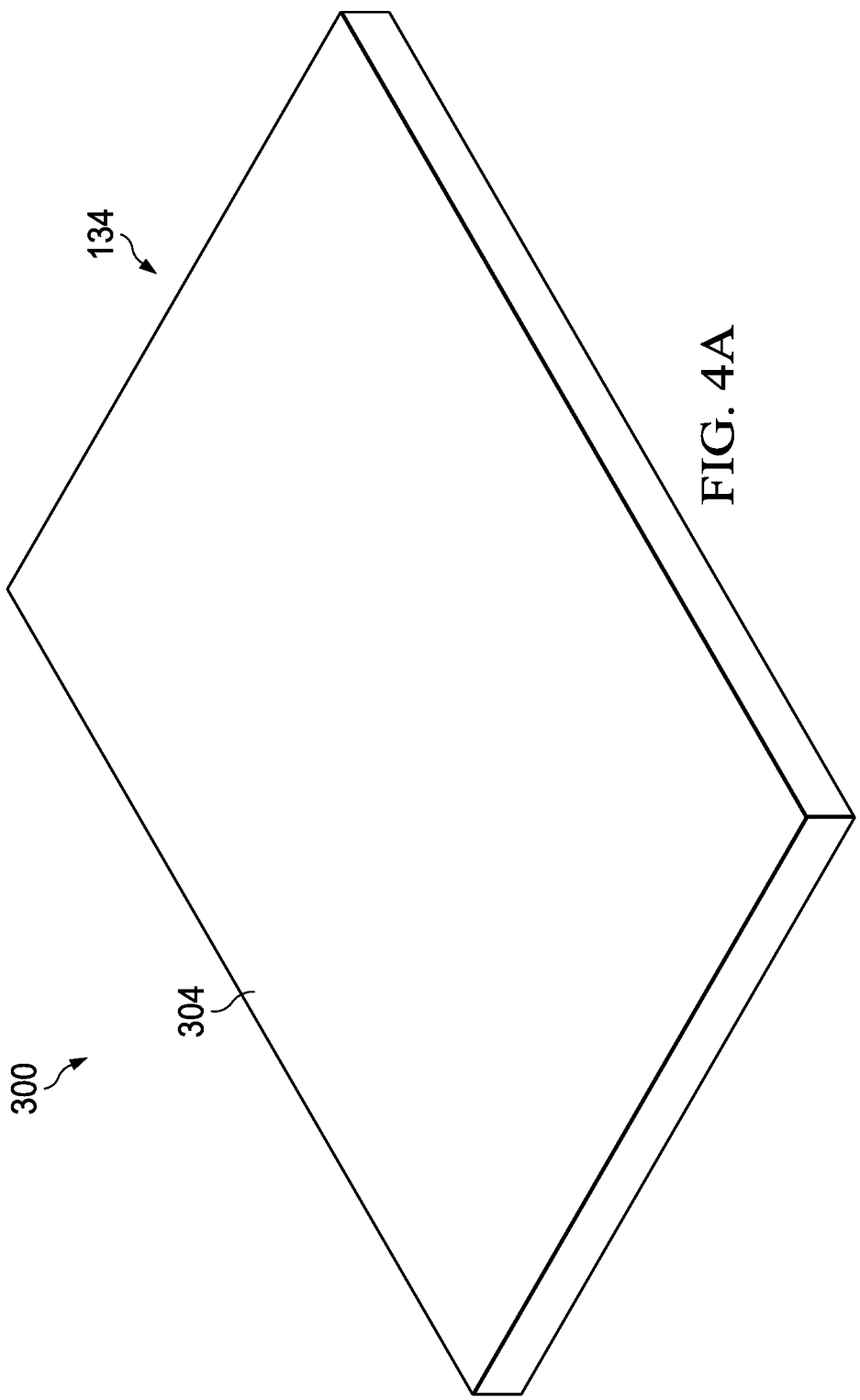
Figure 4B:
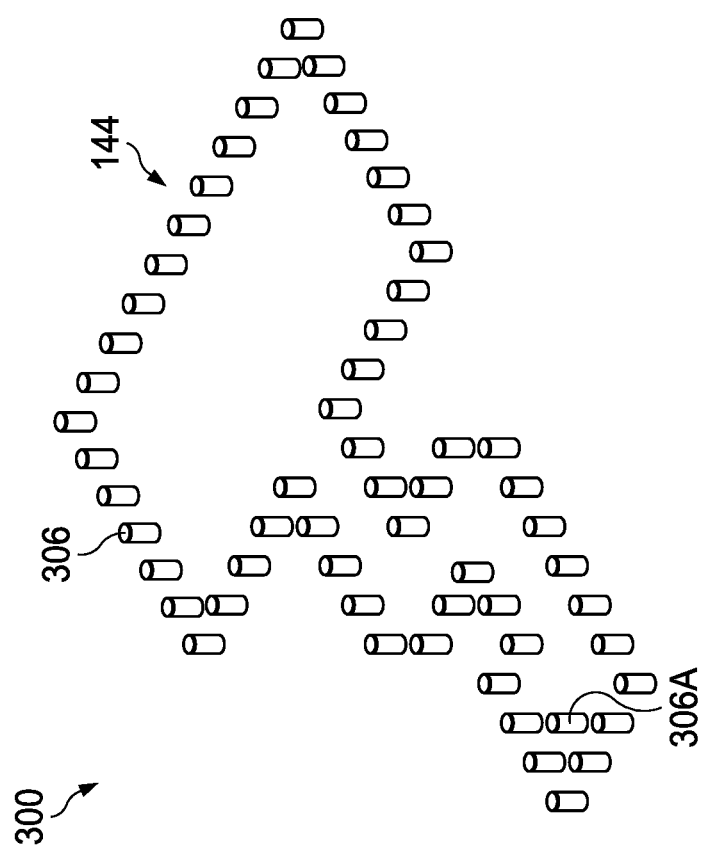
Figure 4C:
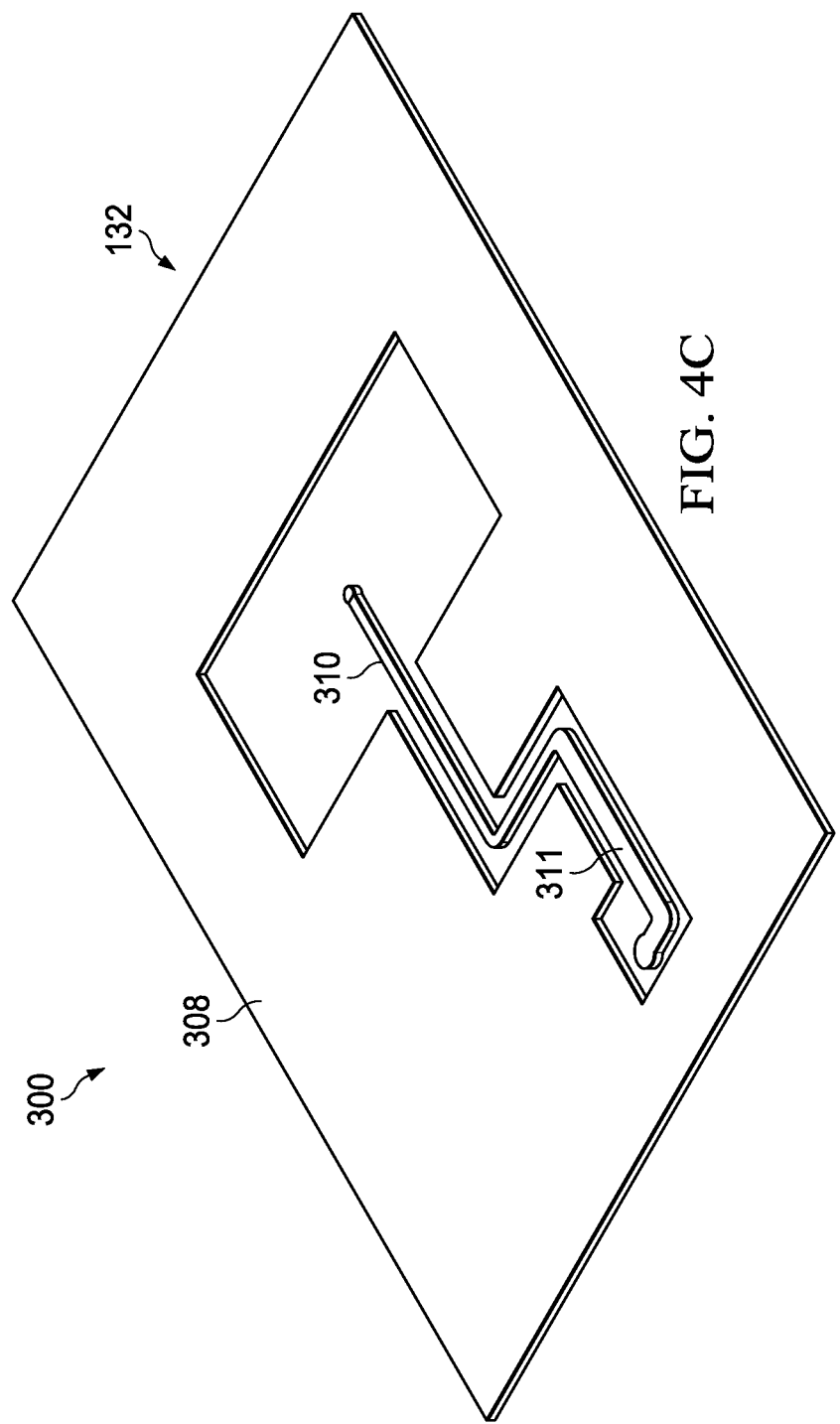
Figure 4E:
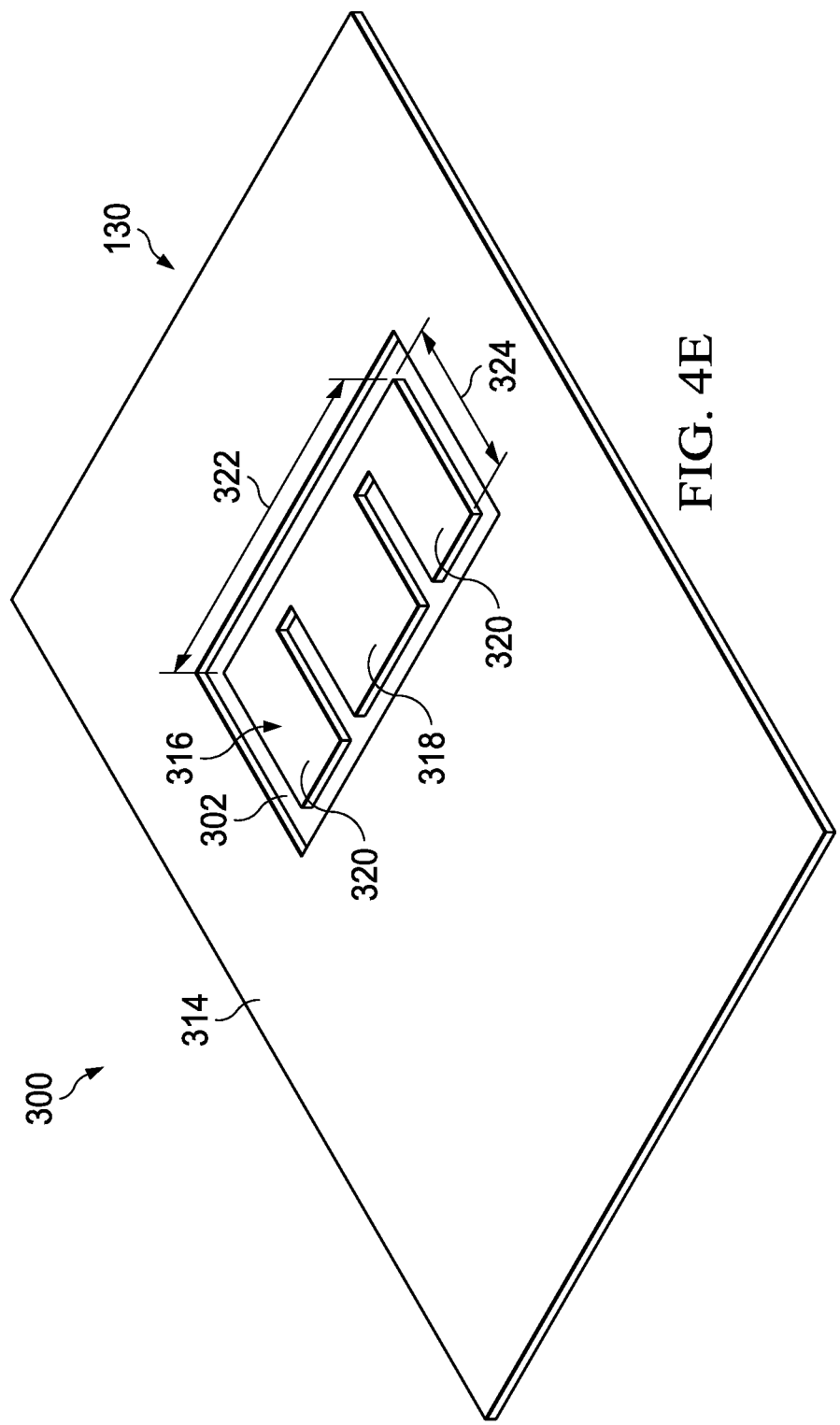

Examples of a package-integrated antenna 302 suitable for use as one of antennas 154 and/or 156 are described with reference to FIGS. 3 and 4A-4E. FIG. 3 is a perspective view of a portion of a package 300 that includes the package-integrated antenna 302 according to some aspects of the present disclosure. FIGS. 4A-4E are perspective views of specific conductor layers of the portion of the package 300. These conductor layers correspond to the layers of the antenna substrate 110 of FIGS. 1 and 2. FIG. 4A is perspective view of an M3 layer 134 of the package 300 that includes the package-integrated antenna 302 according to some aspects of the present disclosure. FIG. 4B is perspective view of a V2 layer 144 of the package 300 that includes the package-integrated antenna 302 according to some aspects of the present disclosure. FIG. 4C is perspective view of an M2 layer 132 of the package 300 that includes the package-integrated antenna 302 according to some aspects of the present disclosure. FIG. 4D is perspective view of a V1 layer 142 of the package 300 that includes the package-integrated antenna 302 according to some aspects of the present disclosure. FIG. 4E is perspective view of an M1 layer 130 of the package 300 that includes the package-integrated antenna 302 according to some aspects of the present disclosure.

The package-integrated antenna 302 may be formed by one or more layers of the package in which it is incorporated. In some examples, the package-integrated antenna 302 includes an M1 layer 130, an M2 layer 132, an M3 layer 134, a V1 layer 142, a V2 layer 144, a front-side solder resist layer 114, an intermediate dielectric layer 116, and core dielectric layer 118 of an antenna substrate 110, each substantially as described above. In the perspective view of FIG. 3, the dielectric layers are translucent to avoid obscuring the conductive features.

Referring first to FIGS. 3 and 4A, in the M3 layer 134, the package 300 may include a first ground plane 304 of conductive material that extends underneath and beyond the antenna 302. Referring to FIGS. 3 and 4B, in the V2 layer 144, the package 300 may include one or more vias 306 that couple the first ground plane 304 to a second ground plane 308 in the M2 layer 132. The vias 306 may define sides of a cavity that lies directly underneath a patch 316 of the antenna 302. The cavity may contain dielectric material of the intervening dielectric layers (e.g., core dielectric layer 118, intermediate dielectric layer 116, etc.) while being free of any conductive features (other than possibly a transmission line 310 and via 312A coupled to the antenna 302) between the antenna patch 316 in the M1 layer 130 and the first ground plane 304 in the M3 layer. In this way, the resulting antenna 302 may be considered a cavity-backed antenna 302. This configuration may improve isolation of the antenna 302 and/or improve radiation efficiency.

Additionally, the vias 306 may define and surround a cut out for a conductive transmission line 310 in the M2 layer 132. The V2 layer 144 may also include one or more vias 306A that couple the transmission line 310 to lower layers and to a bond pad 104 of the die 102.

Referring to FIGS. 3 and 4C, in the M2 layer 132, the package 300 may include the second ground plane 308 that surrounds the antenna 302 but does not extend directly underneath. In this way, the M2 layer 132 further defines the cavity underneath the antenna 302.

The M2 layer 132 may also include the conductive transmission line 310 (e.g., a microstrip or stripline) that couples to the antenna 302. In the case of a transmitter antenna 154, the transmission line 310 carries a driving signal from a die 102 to the antenna 302 that causes the antenna 302 to produce an electromagnetic wave. In the case of a receiver antenna 156, the transmission line 310 carries a signal produced by the antenna 302 in response to a reflected and/or received electromagnetic wave to a die 102 that processes the signal. The second ground plane 308 in the M2 layer 132 may be cut out so as not to couple to the transmission line 310.

To minimize losses and/or to reduce signal reflection, the antenna may be impedance matched to the circuitry of the die 102. Accordingly, in some of the examples of FIG. 4C, the transmission line 310 includes one or more portions 311 with varying trace width to tune the impedance. In some such examples, the transmission line 310 includes a quarter-wave stub in series, such as a quarter-wave transformer stub, configured to adjust the impedance of the antenna to match the impedance of the circuitry on the die 102.

Referring to FIGS. 3 and 4D, in the V1 layer 142, the package 300 may include one or more vias 312 that couple the second ground plane 308 to a third ground plane 314 in the M1 layer 130. The vias 312 may further define the cavity underneath the antenna 302 and further define the cut out for the transmission line 310. The V1 layer 142 may also include one or more vias 312A that couple the transmission line 310 to an antenna patch in the M1 layer 130.

Referring to FIGS. 3 and 4E, in the M1 layer 130, the package 300 may include the third ground plane 314 and the patch 316 of the antenna 302. As noted above, the antenna 302 may be configured to emit and/or receive electromagnetic waves at a set of frequencies. In some examples, the antenna 302 is tuned for 60 GHz radar and provides at least 4 GHz of bandwidth from 60 GHz to 64 GHz. The set of frequencies may govern the shape and structure of the antennas, including the patch 316. In some examples, the patch 316 has a continuous geometric shape (e.g., a simple rectangle that extends uninterrupted from end to end), although it may also have any other suitable antenna shape. Accordingly, in some examples, the patch 316 includes a center portion 318 and side portions 320 disposed on opposite sides that are partially separated from the center portion 318 by recesses that extend partially through the patch 316 in a direction parallel to an edge of the patch 316. In some examples where the patch 316 has a width 322 in a first direction of between about 1000 µm and about 2000 µm and a length 324 in a second direction of between about 700 µm and about 1300 µm, the recesses may extend between about 400 µm and about 1250 µm into the patch 316 in the second direction (e.g., about 50 µm less than the patch length 324). In such examples, the recesses may have a width in the first direction between about 25 µm and about 150 µm and may form the center portion 318 and the side portions 320 to have widths in the first direction of between about 200 µm and about 1800 µm. The widths of the center portion 318 and side portions 320 may be the same or different from one another. Of course, other configurations of the patch 316 are both contemplated and provided for.

Figure 5A:
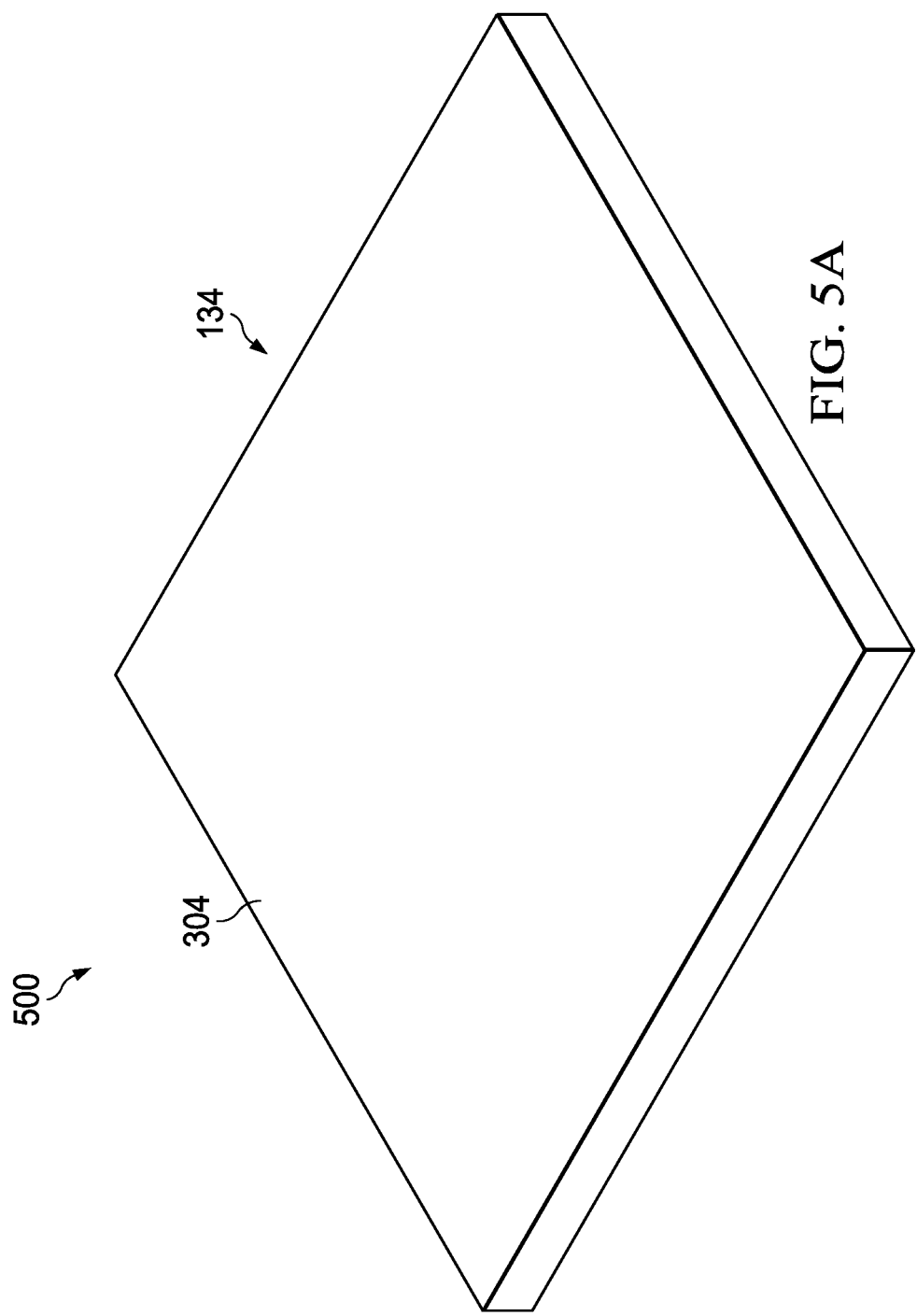
Figure 5B:
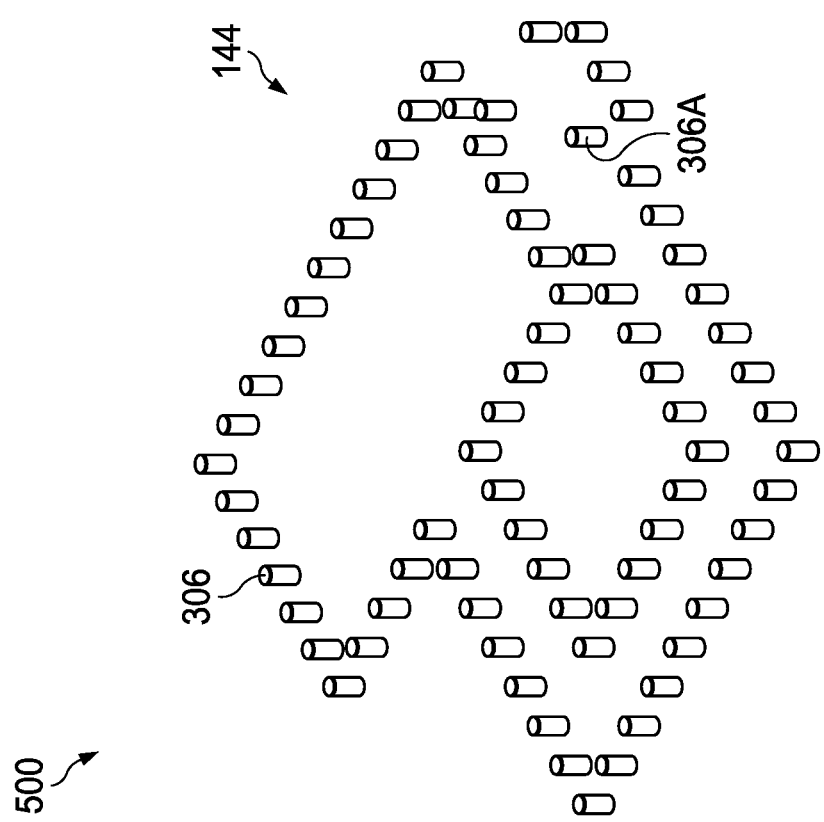
Figure 5C:
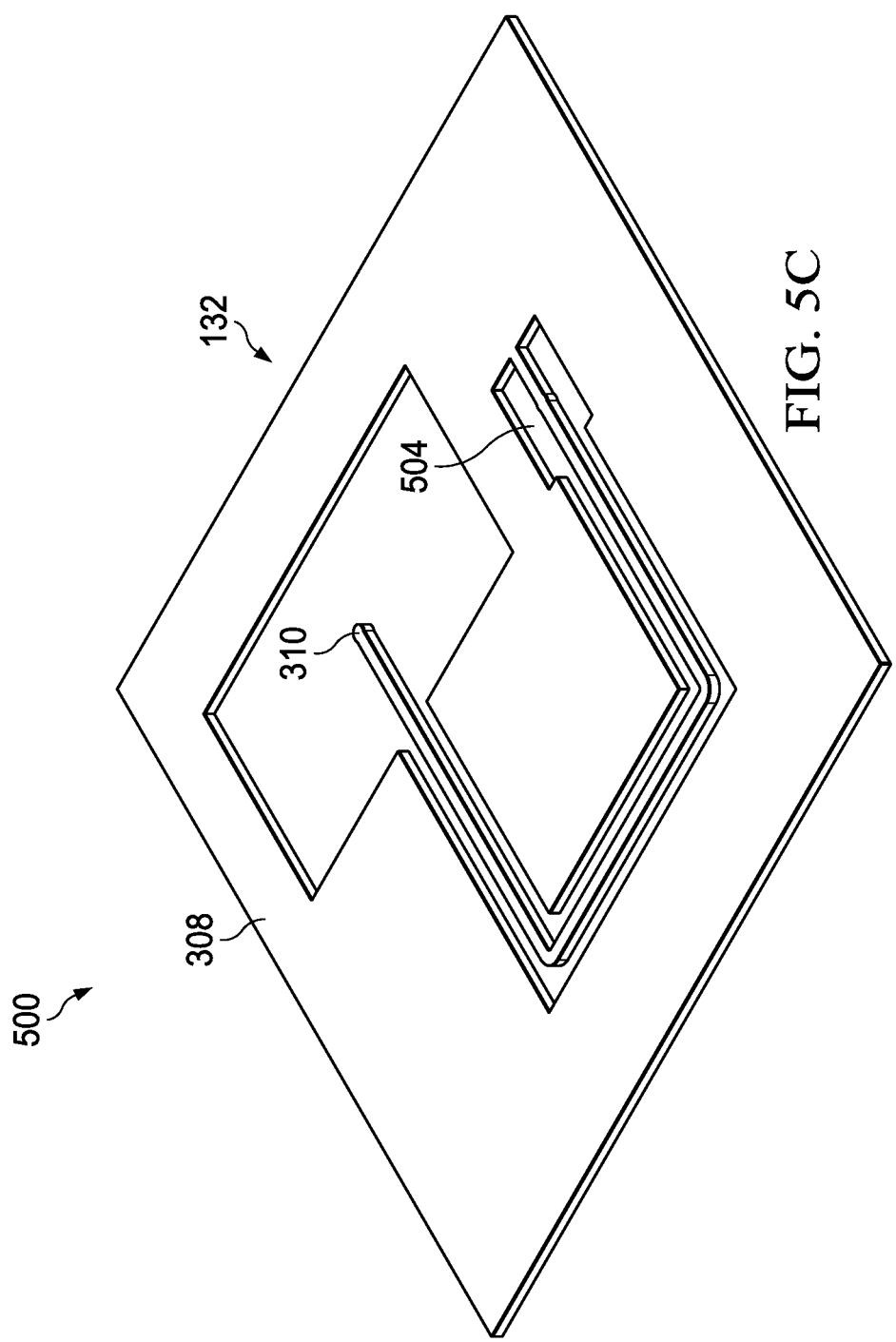
Figure 5E:
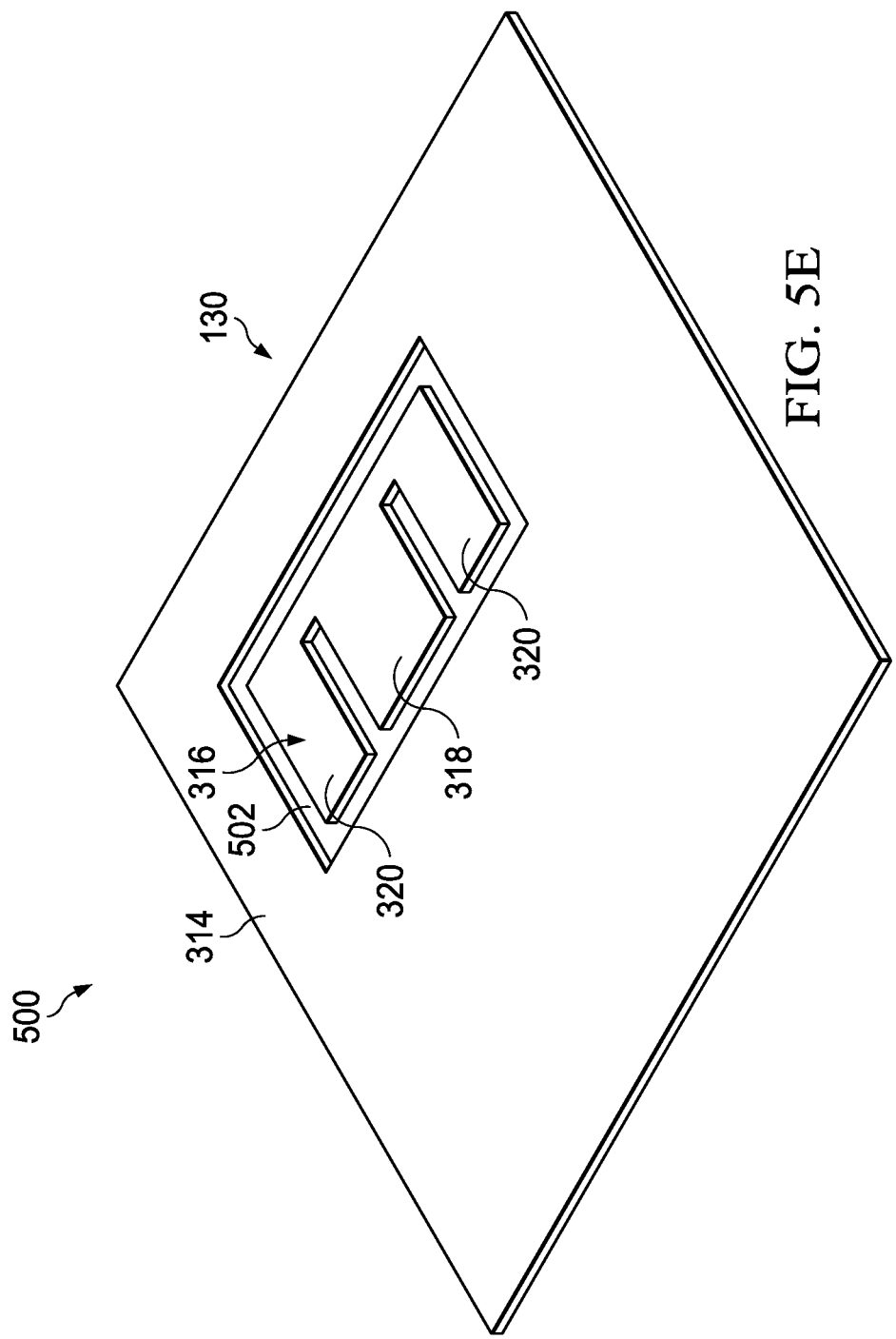

Further examples of a package-integrated antenna 502 suitable for use as one of antennas 154 and/or 156 are described with reference to FIGS. 5A-5E. The layers illustrated in FIGS. 5A-5E correspond to the layers of the antenna substrate 110 of FIGS. 1 and 2. FIG. 5A is perspective view of an M3 layer 134 of a package 500 that includes the package-integrated antenna 502 according to some aspects of the present disclosure. FIG. 5B is perspective view of a V2 layer 144 of the package 500 that includes the package-integrated antenna 502 according to some aspects of the present disclosure. FIG. 5C is perspective view of an M2 layer 132 of the package 500 that includes the package-integrated antenna 502 according to some aspects of the present disclosure. FIG. 5D is perspective view of a V1 layer 142 of the package 500 that includes the package-integrated antenna 502 according to some aspects of the present disclosure. FIG. 5E is perspective view of an M1 layer 130 of the package 500 that includes the package-integrated antenna 502 according to some aspects of the present disclosure.

In many aspects, the package 500 is substantially similar to the package 300 of FIGS. 3-4E. For example, referring to FIG. 5A, the package 500 may include a first ground plane 304 of conductive material in the M3 layer 134 that extends directly underneath and beyond the antenna 502. Referring to FIG. 5B, in the V2 layer 144, the package 500 may include one or more vias 306 that couple the first ground plane 304 to a second ground plane 308 in the M2 layer 132. The vias 306 may define a cavity directly underneath the antenna 502. The V2 layer 144 may also include one or more vias 306A that couple the transmission line 310 to lower layers and to a bond pad 104 of the die 102.

Referring to FIG. 5C, in the M2 layer 132, the package 500 may include the second ground plane 308 that surrounds the antenna 502 but does not extend directly underneath. In this way, the M2 layer 132 further defines the cavity underneath the antenna 502.

The M2 layer 132 may also include the conductive transmission line 310 that couples to the antenna 502. To minimize losses and/or signal reflection, the antenna 502 may be impedance matched to the circuitry of the die 102. Accordingly, in some of the examples of FIG. 5C, the transmission line 310 includes one or more short-circuited or open-circuited stubs 504 to adjust the impedance of the antenna to match the impedance of circuitry on the die 102.

Referring to FIG. 5D, in the V1 layer 142, the package 500 may include one or more vias 312 that couple the second ground plane 308 to a third ground plane 314 in the M1 layer 130. The V1 layer 142 may also include one or more vias 312A that couple the transmission line 310 to an antenna patch in the M1 layer 130.

Referring to FIG. 5E, in the M1 layer 130, the package 500 may include the third ground plane 314 and the patch 316 of the antenna 502. The patch 316 may be substantially similar to that described above and may be configured to emit and/or receive electromagnetic waves at a set of frequencies. In some examples, the patch 316 includes a center portion 318 and side portions 320 disposed on opposite sides that are partially separated from the center portion 318 by recesses that extend partially through the patch 316 in a direction parallel to an edge of the patch 316.

The antennas of FIGS. 3-5E are merely some examples of suitable antennas, and the package may incorporate other suitable antenna structures both additionally and in the alternative.

As shown in FIG. 2, the AOP package 100 may include an EBG structure 166 disposed between the transmitter antennas 154 and the receiver antennas 156. The EBG structure 166 may include any number of repeating EBG cells disposed in direct contact with one another. Examples of an EBG cell 602 suitable for use in the EBG structure 166 are described with reference to FIG. 6. FIG. 6 is a perspective view of a package 600 that includes the EBG cell 602 according to some aspects of the present disclosure. Adjacent EBG cells 602 align along the dashed boundary.

The EBG cell size depends on the frequency or frequency range that the EBG cell 602 is intended to dampen. In some examples, it is a square cell with a length and a width between about 200 µm to 500 µm to dampen 57 GHz to 64 GHz waves.

Similar to a package-integrated antenna, the EBG cell 602 may be formed from one or more layers of the package in which it is incorporated. In some examples, the EBG cell 602 includes features of an M1 layer 130, an M2 layer 132, an M3 layer 134, a V1 layer 142, a V2 layer 144, a front-side solder resist layer 114, an intermediate dielectric layer 116, and a core dielectric layer 118 of an antenna substrate 110, each substantially as described above. For clarity, the dielectric layers are transparent to show the underlying conductor layers.

In the M3 layer 134, the EBG cell 602 may include a bottom conductive feature 604 that extends along an entirety of the EBG cell 602. When the EBG cell 602 is disposed next to another EBG cell 602 in an EBG structure 166, the bottom conductive feature 604 may couple across EBG cells 602 so that the combined bottom conductive feature 604 extends along the entirety of the EBG structure 166. In particular, the combined bottom conductive features 604 may extend past the EBG structure 166 to couple to the first ground plane 304 underneath the antenna(s) 302.

In the M2 layer 132, the EBG cell 602 may include an intermediate conductive feature 606. The intermediate conductive feature 606 may have any suitable shape depending on the frequency or frequency range that the EBG cell 602 is intended to dampen. In some examples, the intermediate conductive feature 606 is a rectangular prism with a length that is between about 200 µm and about 500 µm and a width that is between about 200 µm and about 500 µm. The intermediate conductive feature 606 may be sized such that an intermediate conductive feature 606 of an EBG cell 602 and an intermediate conductive feature 606 of an adjacent EBG cell 602 are separated by a gap that is between about 20 µm and about 100 µm.

In the V2 layer 144, the EBG cell 602 may include a via 608 that couples the bottom conductive feature 604 to the intermediate conductive feature 606.

In the M1 layer 130, the EBG cell 602 may include a top conductive feature 610. As with the intermediate conductive feature 606, the top conductive feature 610 may have any suitable shape depending on the frequency or frequency range that the EBG cell 602 is intended to dampen. In some examples, the top conductive feature 610 is a rectangular prism substantially the same size and shape as the underlying intermediate conductive feature 606 (e.g., a length between about 200 µm and about 500 µm and a width between about 200 µm and about 500 µm). The top conductive feature 610 may be sized such that a top conductive feature 610 of an EBG cell 602 and a top conductive feature 610 of an adjacent EBG cell 602 are separated by a gap that is between about 20 µm and about 100 µm.

In the V1 layer 142, the EBG cell 602 may include a via 612 that couples the intermediate conductive feature 606 to the top conductive feature 610.

Of course, these are merely some examples of an EBG cell 602 and other suitable EBG cells 602 are both contemplated and provided for.

Figure 7:
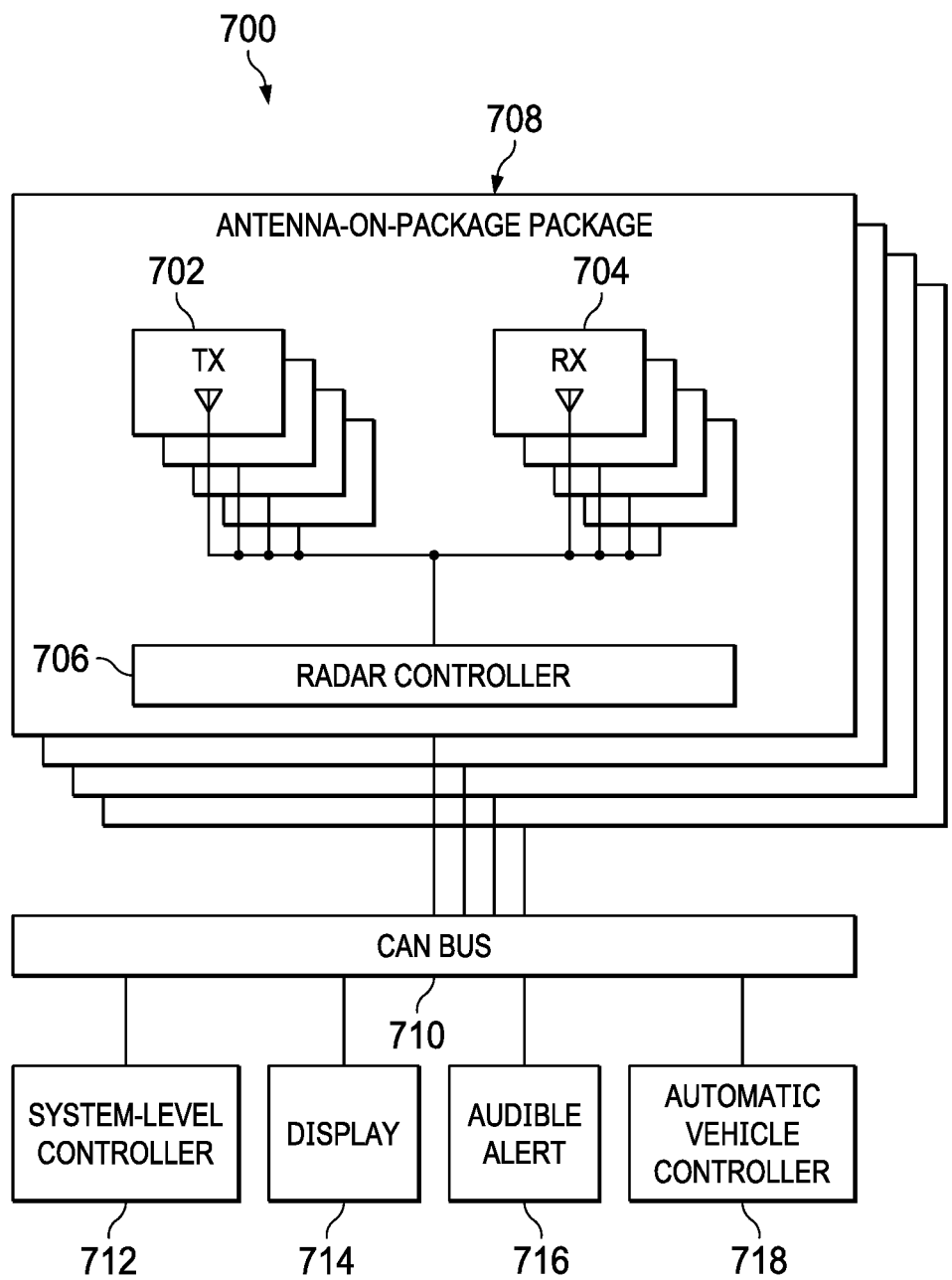
FIG. 7 is a block diagram of a vehicle radar system according to some aspects of the present disclosure.

An example of a system 700 in which the AOP integrated circuit packages 100, 300, 500, and/or 600 may be used is described with reference to FIG. 7. In that regard, FIG. 7 is a block diagram of a vehicle radar system 700 according to some aspects of the present disclosure.

The system 700 includes a set of transmitter antennas 702, a set of receiver antennas 704, and a radar controller 706. The transmitter antennas 702 may be substantially similar to transmitter antennas 154 above, and the receiver antennas 704 may be substantially similar to the receiver antennas 156 above. Accordingly, the set of transmitter antennas 702 and the set of receiver antennas 704 may be physically incorporated into an AOP integrated circuit package 708 substantially similar to circuit packages 100, 300, 500, and/or 600, above. In turn, the radar controller 706 may be housed in one or more dies, such as the die 102 above, and physically incorporated into the AOP integrated circuit package 708.

The system 700 may be incorporated into an automobile or other vehicle by deploying any number of instances of the integrated circuit package 708 around the perimeter to detect other vehicles, within the interior to detect passengers, and/or in any other suitable location throughout the vehicle. In some examples, the system 700 includes as many as 30 or more integrated circuit packages 708 deployed throughout the vehicle for collision avoidance.

The system 700 further includes a Controller Area Network (CAN) bus 710 that communicatively couples the integrated circuit packages 708 to one or more of a system-level controller 712, a display 714, an audible alert device 716, and/or an automatic vehicle steering controller 718.

In operation, the radar controller 706 generates a radar signal and one or more of the transmitter antennas 702 radiate a corresponding electromagnetic wave. Objects within the surrounding environment may reflect the electromagnetic wave causing a reflected echo to be received by one or more of the receiver antennas 704. The radar controller 706 may receive the corresponding radar signal from the receiver antennas 704 and may process the signal. The radar controller 706 may then transmit digital information regarding the radar signal or the radar return over the CAN bus 710.

The system-level controller 712 receives the information from the CAN bus 710, and processes the information. In some examples, the system-level controller 712 processes the information to determine whether a collision is impending. If so, the system-level controller 712 may send a warning or notification that causes the display 714 and/or to the audible alert device 716 to alert the driver. Additionally or in the alternative, the system-level controller 712 may send a command to the automatic vehicle steering controller 718 to take action to avoid the collision, such as steering or breaking. Such collision avoidance steering commands may be conditioned on the system-level controller 712 determining, based on inputs from other AOP integrated circuit packages 708, that steering away from the impending collision would not steer into a different collision situation.

It is understood that the integrated circuit packages described herein may advantageously be used in other systems and designs, unrelated to automobile radars. In that regard, while an automobile radar MMIC is an example of the present disclosure, it is understood that application of these teachings to other non-automotive and non-radar applications is consistent with and contemplated by the present disclosure.

What is claimed is:

1. An integrated circuit package comprising:
   an antenna substrate including a first dielectric layer, and a plurality of conductor layers including a first conductor layer, a transmitter antenna formed by the first conductor layer, a receiver antenna formed by the first conductor layer, a second conductor layer disposed on a first side of the first dielectric layer and a third conductor layer disposed on a second side of the first dielectric layer, the second side being opposite the first side;
   an electromagnetic bandgap structure formed in part by the first, second and third conductor layers, a portion of the electromagnetic bandgap structure that is formed by the first conductor layer being disposed between the transmitter antenna and the receiver antenna;
   an I/O substrate including a second dielectric layer and a second set of package connectors disposed on the second dielectric layer;
   a first set of package connectors that physically and electrically couple the antenna substrate to the I/O substrate; and
   an integrated circuit die disposed alongside the first set of package connectors;
   wherein the integrated circuit die and the first set of package connectors are positioned between the antenna substrate and the I/O substrate;
   wherein the integrated circuit die includes a bond pad positioned on a first side of the integrated circuit die, and the bond pad is coupled to the second side of the first dielectric layer;
   wherein the bond pad is electrically connected to the first conductor layer;
   wherein the antenna substrate is coupled to the first side of the integrated circuit die;
   wherein the first dielectric layer positioned between the integrated circuit die and the first conductor layer that forms the transmitter antenna and the receiver antenna; and
   wherein the second dielectric layer is positioned between the second set of the package connectors and the integrated circuit die.

2. The integrated circuit package of claim 1, wherein the first conductor layer includes transmitter antennas including the transmitter antenna and receiver antennas including the receiver antenna arranged in a multi-input multi-output array.

3. The integrated circuit package of claim 2, wherein the transmitter antennas are arranged in a first multi-dimensional array and the receiver antennas are arranged in a second multi-dimensional array.

4. The integrated circuit package of claim 2, wherein the first conductor layer is coupled to the second conductor layer by a first via, and the second conductor layer is coupled to the third conductor layer by a second via.

5. The integrated circuit package of claim 1, wherein at least one of the transmitter antenna and the receiver antenna has:
   a center portion;
   a first side portion partially separated from the center portion by a first recess; and
   a second side portion partially separated from the center portion by a second recess.

6. The integrated circuit package of claim 1, wherein the first set of package connectors includes at least one of: a ball grid array connector, a land grid array connector, a pin grid array connector, or a surface-mount lead.

7. The integrated circuit package of claim 6, wherein the second set of package connectors includes at least one of: a ball grid array connector, a land grid array connector, a pin grid array connector, or a surface-mount lead.

8. The integrated circuit package of claim 1 further comprising a mold compound disposed between the antenna substrate and the I/O substrate,
   wherein the mold compound is disposed between the first set of package connectors and the integrated circuit die.

9. The integrated circuit package of claim 8, wherein the mold compound further extends between the integrated circuit die and the I/O substrate.

10. The integrated circuit package of claim 2,
wherein the transmitter antenna is a first transmitter antenna of the transmitter antennas and is offset from a second transmitter antenna of the transmitter antennas in a first direction, and
wherein the first transmitter antenna is offset from a third transmitter antenna of the transmitter antennas in a second direction perpendicular to the first direction.

11. The integrated circuit package of claim 2,
wherein the receiver antenna is a first receiver antenna of the receiver antennas and is offset from a second receiver antenna of the receiver antennas in a first direction, and
wherein the first receiver antenna is offset from a third receiver antenna of the receiver antennas in a second direction perpendicular to the first direction.

12. The integrated circuit package of claim 1, wherein the bond pad of the integrated circuit die is physically coupled to the antenna substrate.

* * * * *